(12) United States Patent
Chuang et al.

(10) Patent No.: US 8,942,027 B1
(45) Date of Patent: Jan. 27, 2015

(54) MEMORY STORAGE CIRCUIT AND METHOD OF DRIVING MEMORY STORAGE CIRCUIT

(71) Applicant: Industrial Technology Research Institute, Chutung, Hsinchu (TW)

(72) Inventors: Ching-Hao Chuang, Huatan Township (TW); Meng-Fan Chang, Taichung (TW); Shyh-Shyuan Sheu, Taipei (TW); Zhe-Hui Lin, Fuxing Township (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 0 days.

(21) Appl. No.: 13/939,062

(22) Filed: Jul. 10, 2013

(51) Int. Cl.
G11C 11/00 (2006.01)
G11C 14/00 (2006.01)
G11C 13/00 (2006.01)

(52) U.S. Cl.
CPC .......... *G11C 14/009* (2013.01); *G11C 13/0069* (2013.01)
USPC .......................................... 365/148; 365/154

(58) Field of Classification Search
CPC .................................................... G11C 14/009
USPC .................................................. 395/148, 154
See application file for complete search history.

(56) References Cited

U.S. PATENT DOCUMENTS

| | | | |
|---|---|---|---|
| 6,175,525 B1 | 1/2001 | Fulkerson et al. | |
| 6,269,027 B1 | 7/2001 | Hurst, Jr. et al. | |
| 6,363,011 B1 | 3/2002 | Hirose et al. | |
| 6,862,226 B2 | 3/2005 | Toyoda et al. | |
| 7,082,053 B1 | 7/2006 | Jenne et al. | |
| 7,206,217 B2 | 4/2007 | Ohtsuka et al. | |
| 7,560,965 B2 | 7/2009 | Waldrip et al. | |
| 7,733,145 B2 | 6/2010 | Abe et al. | |
| 7,760,538 B1 | 7/2010 | Paak | |
| 7,903,451 B2 | 3/2011 | Yamada et al. | |
| 8,174,872 B2 | 5/2012 | Sakimura et al. | |
| 2004/0141363 A1 | 7/2004 | Ohtsuka et al. | |
| 2010/0208512 A1* | 8/2010 | Ueda | 365/148 |
| 2010/0271866 A1* | 10/2010 | Sakimura et al. | 365/158 |

(Continued)

OTHER PUBLICATIONS

Masui at al., "Design and Applications of Ferroelectric Nonvolatile SRAM and Flip-Flop with Unlimited Read/Program Cycles and Stable Recall", IEEE 2003 Custom Integrated Circuits Conference, 2003, pp. 403-406.

(Continued)

*Primary Examiner* — Hoai V Ho
(74) *Attorney, Agent, or Firm* — Muncy, Geissler, Olds & Lowe, P.C.

(57) ABSTRACT

A memory storage circuit includes a volatile memory portion, a control portion, and a non-volatile memory portion. The volatile memory portion includes a first node and a second node to store a pair of complementary logic data. The control portion includes a first transistor and a second transistor. Gate electrodes of the first and second transistors are coupled to receive a store signal, and first electrodes of the first and second transistors are coupled to receive a control signal. The non-volatile memory portion includes a first resistive memory element and a second resistive memory element to store the pair of complementary logic data. The first resistive memory element is coupled between a second electrode of the first transistor and the first node, and the second resistive memory element is coupled between a second electrode of the second transistor and the second node.

16 Claims, 7 Drawing Sheets

(56) References Cited

U.S. PATENT DOCUMENTS

2011/0273925 A1* 11/2011 Yamamoto et al. ............ 365/154
2011/0280073 A1* 11/2011 Chiu et al. ............... 365/185.08

OTHER PUBLICATIONS

Zhao et al., "A Non-Volatile Flip-Flop in Magnetic FPGA Chip", International Conference on Design and Test of Integrated Systems in Nanoscale Technology, DTIS 2006, Mar. 26, 2006, 4 pages total.

Zhao et al., "Embedded MRAM for High-Speed Computing", 2011 IEEE/IFIP 19th International Conference on VLSI and System-On-Chip, 2011, pp. 37-42.

Lakys et al., "Hardening Techniques for MRAM-Based Non-Volatile Storage Cells and Logic", RADECS 2011 Proceedings, 2011, pp. 669-674.

Jung et al., "Zero-Sleep-Leakage Flip-Flop Circuit With Conditional-Storing Memristor Retention Latch", IEEE Transactions on Nanotechnology, vol. 11, No. 2, Mar. 2012, pp. 360-366.

Wang et al., "Nonvolatile SRAM Cell", IEEE International Electron Devices Meeting (IEDM), Dec. 11, 2006, 4 pages total.

Yamamoto et al., "Nonvolatile SRAM (NV-SRAM) Using Functional MOSFET Merged with Resistive Switching Devices", IEEE 2009 Custom Integrated Circuit Conference, Sep. 13, 2009, pp. 531-534.

Chiu et al., "Low Store Energy, Low VDDmin, 8T2R Nonvolatile Latch and SRAM with Vertical-Stacked Resistive Memory (Memristor) Devices for Low Power Mobile Applications", IEEE Journal of Solid-State Circuits, vol. 47, No. 6, Jun. 2012, pp. 1483-1496.

* cited by examiner

MEMORY STORAGE CIRCUIT AND METHOD OF DRIVING MEMORY STORAGE CIRCUIT

TECHNICAL FIELD

This disclosure is directed to a storage circuit, and more particularly, to a memory storage circuit and method of driving memory storage circuit.

BACKGROUND

A flip-flop circuit is a widely used storage circuit in digital electronic systems such as computers, telecommunication systems, and many other types of systems. The flip-flop circuit can retain logic data obtained from calculation. At present, low power consumption is a general requirement for digital electronic systems. However, when a system having the flip-flop circuit is in a standby state, leakage current may flow through the flip-flop circuit, which may cause the system to consume excess power.

In order to achieve low power consumption, the general flip-flop circuit may be replaced by low leakage transistors configured as a retention latch. Alternatively, the general flip-flop circuit may be replaced by a non-volatile flip-flop circuit which retains logic data even when no power is supplied to the system.

SUMMARY

According to an embodiment of the disclosure, there is provided a memory storage circuit including a volatile memory portion, a control portion, and a non-volatile memory portion. The volatile memory portion includes a first node and a second node to store a pair of complementary logic data as respective different electrical potentials. The control portion includes a first transistor and a second transistor each having a gate electrode, a first electrode, and a second electrode. The gate electrode of the first transistor and the gate electrode of the second transistor are coupled to receive a store signal. The first electrode of the first transistor and the first electrode of the second transistor are coupled to receive a control signal. The non-volatile memory portion includes a first resistive memory element and a second resistive memory element to store the pair of complementary logic data as respective different resistance states. The first resistive memory element is coupled between the second electrode of the first transistor and the first node, and the second resistive memory element is coupled between the second electrode of the second transistor and the second node.

According to another embodiment of the disclosure, there is provided a method of driving the memory storage circuit. The method includes performing a store operation for storing a pair of complementary logic data with different electrical potentials to a first resistive memory element in a non-volatile memory portion and a second resistive memory element in the non-volatile memory portion as different resistance states. The store operation includes: a first operation for configuring a first one of the first resistive memory element and the second resistive memory element to a low resistance state based on the electrical potentials at a first node in a volatile memory portion and a second node in the volatile memory portion, wherein the first resistive memory element is coupled to the first node and the second resistive memory element is coupled to the second node; and a second operation for configuring a second one of the first resistive memory element and the second resistive memory element to a high resistance state based on the electrical potentials at the first node and the second node.

According to a further embodiment of the disclosure, there is provided a method of driving a memory storage circuit. The method includes receiving logic data at a volatile memory portion, storing the logic data in the volatile memory portion, and outputting the stored logic data. The method also includes determining whether a standby state is pending, and when a standby state is pending, storing the logic data stored in the volatile memory portion to a first resistive memory element and a second resistive memory element. The method further includes determining whether a restore operation is required, and when a restore operation is required, restoring the logic data stored in the first resistive memory element and the second resistive memory element to the volatile memory portion. The storing the logic data stored in the volatile memory portion to the first resistive memory element and the second resistive memory element includes configuring a first one of the first resistive memory element and the second resistive memory element into a low resistance state, and configuring a second one of the first resistive memory element and the second resistive memory element into a high resistance state.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems and methods consistent with aspects related to the invention as recited in the appended claims.

(Configuration of Electronic System)

Figure 1:
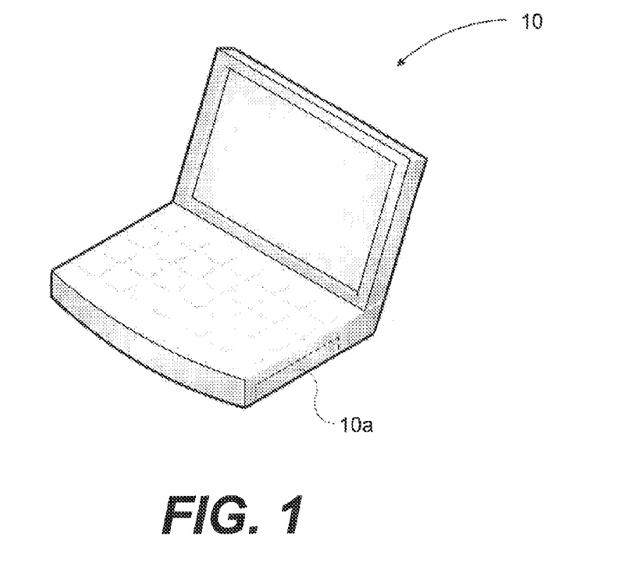
FIG. 1 is a block diagram showing an exemplary electronic system.

FIG. 1 is a block diagram showing an exemplary electronic system 10 in which an embodiment of the disclosure may be employed. The electronic system 10 shown in FIG. 1 is a laptop computer that includes a memory storage device 10a. It will be recognized that the electronic system 10 may instead comprise a tablet, a smartphone, etc.

Figure 2:
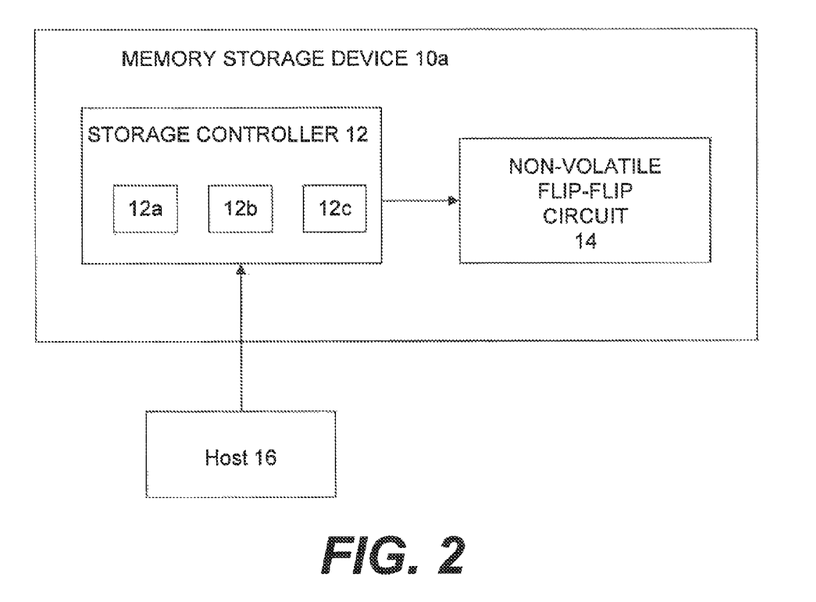
FIG. 2 is a block diagram of a memory storage device constructed according to an exemplary embodiment.

FIG. 2 is a block diagram of a memory storage device 10a constructed according to an exemplary embodiment. The memory storage device 10a includes a storage controller 12 and a non-volatile flip-flop circuit 14. The storage controller 12 interfaces with a host 16 located within the electronic system 10. For example, the storage controller 12 receives logic data from the host 16, and stores the logic data in the non-volatile flip-flop circuit 14 by supplying input data D to the non-volatile flip-flop circuit 14. The storage controller 12 also manages different operations of the non-volatile flip-flop circuit 14 by supplying various signals to the non-volatile flip-flop circuit 14. For example, the storage controller 12 supplies an input enable signal IN_EN, an inverted input enable signal IN_EN_B, a power signal CVDD, a clock signal CLK, an inverted clock signal CLK_B, a control signal CTRL, and a store signal STORE to the non-volatile flip-flop circuit 14. The storage controller 12 includes a processor 12a, a first storage unit 12b, and a second storage unit 12c that are included together in a single device and/or provided separately. The processor 12a may include one or more known processing devices, such as a microprocessor from the Pentium™ or Xeon™ family manufactured by Intel™, the Turion™ family manufactured by AMD™, or any other type of processor that is capable of controlling operations of the non-volatile flip-flop circuit 14 in response to various inputs from the host 16. The first storage unit 12b includes one or more storage devices configured to store information used by the storage controller 12 to perform certain functions related to the disclosed embodiments. The second storage unit 12c includes a volatile or non-volatile, magnetic, semiconductor, tape, optical, removable, nonremovable, or other type of storage device or computer-readable medium. The second storage unit 12c is configured to store programs and/or other information, such as information related to processing data received from the host 16. Various other circuits may be associated with the storage controller 12, including power supply circuitry, signal-conditioning circuitry, etc.

(Configuration of Non-Volatile Flip-Flop Circuit)

Figure 3:
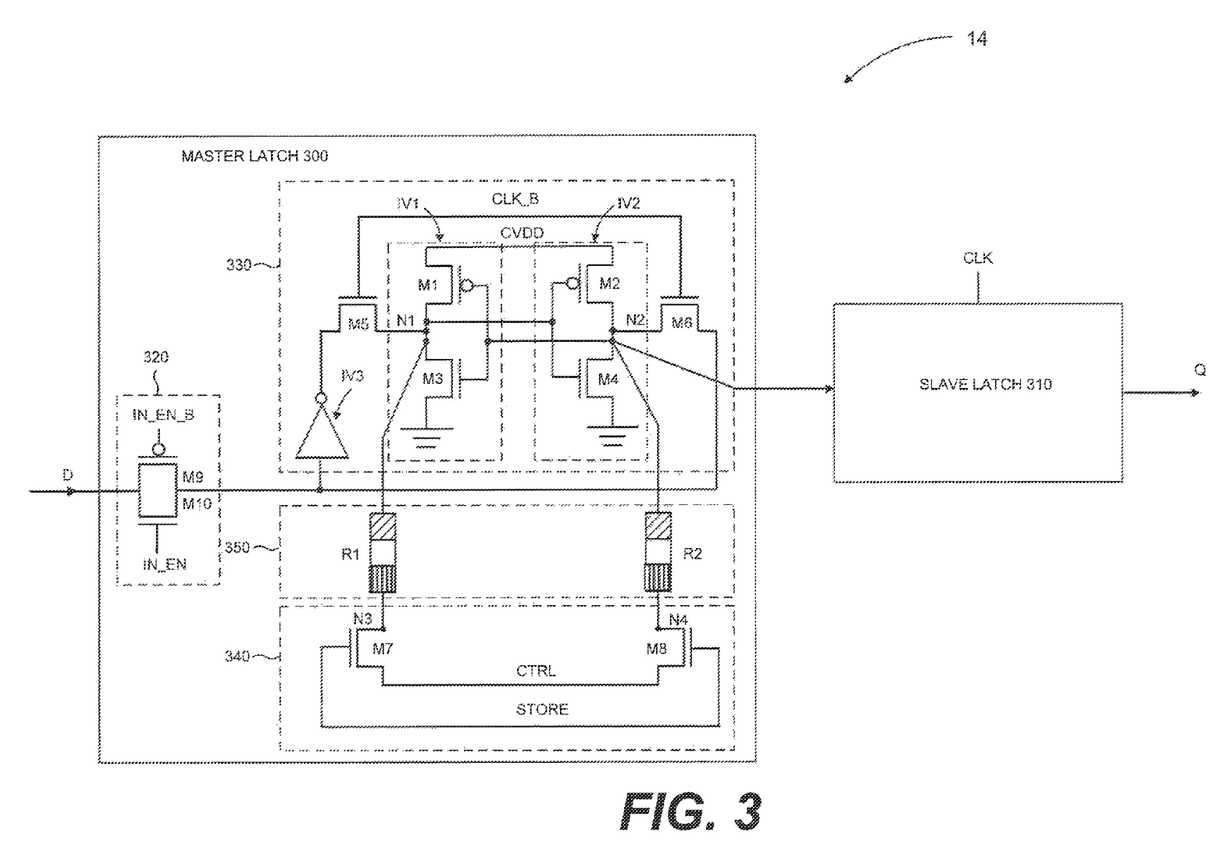
FIG. 3 is a circuit diagram of a non-volatile flip-flop circuit constructed according to an exemplary embodiment.

FIG. 3 is a circuit diagram of the non-volatile flip-flop circuit 14 constructed according to an exemplary embodiment. The non-volatile flip-flop circuit 14 includes a master latch circuit 300 coupled in series with a slave latch circuit 310. The master latch circuit 300 receives the input data D from the storage controller 12. The slave latch circuit 310 receives an output from the master latch circuit 300 and the clock signal CLK from the storage controller 12, and outputs output data Q in accordance with the clock signal CLK.

The master latch circuit 300 includes a transmission gate 320, a volatile memory portion 330, a control portion 340, and a non-volatile memory portion 350. The transmission gate 320 includes a PMOS transistor M9 and an NMOS transistor M10 coupled such that both of the transistors M9 and M10 are turned on or turned off in response to the states of the input enable signal IN_EN and the inverted input enable signal IN_EN_B supplied from the storage controller 12 and applied to gates of the transistors M9 and M10. An input terminal of the transmission gate 320 is coupled to receive the input data D. When the input enable signal IN_EN is at a low level and the inverted input enable signal IN_EN_B is at a high level, both of the transistors M9 and M10 are turned off, and the input data D is not transmitted through the transmission gate 320. When the input enable signal IN_EN is at the high level and the inverted input enable signal IN_EN_B is at the low level, both of the transistors M9 and M10 are turned on, and the input data D is transmitted through the transmission gate 320.

The volatile memory portion 330 includes components that are configured to store logic data in the presence of power. The non-volatile memory portion 350 includes components that are configured to store logic data with and without the presence of power. The control portion 340 includes components that are configured to control the operation of the non-volatile memory portion 350.

Specifically, the volatile memory portion 330 includes cross-coupled inverters IV1 and IV2. That is, an output terminal of the inverter IV1 and an input terminal of the inverter IV2 are connected to a node N1, and an output terminal of the inverter IV2 and an input terminal of the inverter IV1 are connected to a node N2. The inverter IV1 includes a PMOS transistor M1 and an NMOS transistor M3. The inverter IV2 includes a PMOS transistor M2 and an NMOS transistor M4. Source electrodes of the PMOS transistors M1 and M2 are connected to receive a power signal CVDD. Source electrodes of the NMOS transistors M3 and M4 are connected to reference or ground. Drain electrodes of the PMOS transistor M1 and the NMOS transistor M3 are connected to the node N1, and drain electrodes of the PMOS transistor M2 and the NMOS transistor M4 are connected to the node N2. The node N2 is also connected to the input of the slave latch circuit 310.

The volatile memory portion 330 further includes an inverter IV3, and NMOS transistors M5 and M6 that are pass transistors for feeding the input data D to the inverters IV1 and IV2. An input terminal of the inverter IV3 is connected to an output terminal of the transmission gate 320 to receive the input data D. The NMOS transistor M5 has a gate electrode for receiving an inverted clock signal CLK_B, a first electrode (i.e., a source or drain electrode) connected to an output terminal of the inverter IV3 for receiving inverted input data D_B, and a second electrode (i.e., a drain or source electrode) connected to the node N1 for supplying the inverted input data D_B to the node N1. The NMOS transistor M6 has a gate electrode for receiving the inverted clock signal CLK_B, a first electrode connected to the output terminal of the transmission gate 320 to receive the input data D, and a second electrode connected to the node N2 for supplying the input data D to the node N2. Thus, the nodes N1 and N2 have different electrical potentials corresponding to a pair of complementary logic data stored in the volatile memory portion 330. In the present disclosure, the nodes N1 and N2 are formed of conductive connections between the output terminal of the inverter IV1 and the input terminal of the inverter IV2, and between the output terminal of the inverter IV2 and the input terminal of the inverter IV1, respectively. The electrical potentials at the nodes N1 and N2 represent the complementary logic data stored in the volatile memory portion 330. Accordingly, the nodes N1 and N2 are described herein as memory nodes that store the pair of complementary logic data.

When the input data D is "0", the node N1 has a high electrical potential and the node N2 has a low electrical potential, thus logic data "1" is stored at the node N1, and logic data "0" is stored at the node N2. Alternatively, when the input data D is "1", the node N1 has the low electrical potential and the node N2 has the high electrical potential, thus logic data "0" is stored at the node N1, and logic data "1" is stored at the node N2.

The control portion 340 includes NMOS transistors M7 and M8. Gate electrodes of the NMOS transistors M7 and M8 are connected to receive a store signal STORE. First electrodes of the NMOS transistors M7 and M8 are connected together and to receive a control signal CTRL. Second electrodes of the NMOS transistors M7 and M8 are connected to the non-volatile memory portion 350.

The non-volatile memory portion 350 includes resistive memory elements R1 and R2. The resistive memory element R1 is coupled between the node N1 and the second electrode of the NMOS transistor M7. The resistive memory element R2 is coupled between the node N2 and the second electrode of the NMOS transistor M8. Each one of the resistive memory elements R1 and R2 includes a top electrode and a bottom electrode. The top electrode of the resistive memory element R1 and the second electrode of the NMOS transistor M7 are connected together at node N3. The bottom electrode of the resistive memory element R1 is connected to the node N1. Similarly, the top electrode of the resistive memory element R2 and the second electrode of the NMOS transistor M8 are connected together at node N4. The bottom electrode of the resistive memory element R2 is connected to the node N2.

(Configuration of $HfO_2$-Based RRAM Device)

Figure 4:
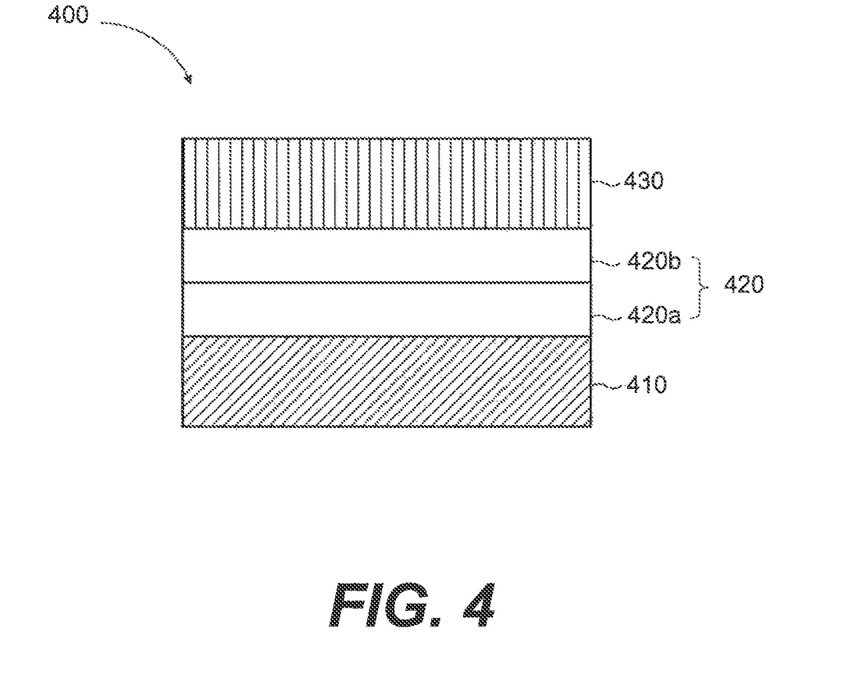
FIG. 4 is a cross-sectional view of a $HfO_2$-based RRAM device constructed as an exemplary embodiment.

In this embodiment, each one of the resistive memory elements R1 and R2 is a $HfO_2$-based resistive random access memory (RRAM) device. FIG. 4 is a cross-sectional view of a $HfO_2$-based RRAM device 400 constructed as an exemplary embodiment. The $HfO_2$-based RRAM device 400 is constructed with a bottom electrode 410, an oxygen getter layer 420, and a top electrode 430. Both of the bottom electrode 410 and the top electrode 430 are formed of TiN. The oxygen getter layer 420 includes a $HfO_2$ layer 420a formed on the bottom electrode 410 and a Ti layer 420b formed on the $HfO_2$ layer 420a. The resistance of the $HfO_2$-based RRAM device 400 may be varied based on a direction of a voltage bias applied to it. In other words, the resistance of the $HfO_2$-based RRAM device 400 is varied based on whether a forward bias or a reverse bias is applied to it. When the forward bias is applied to the $HfO_2$-based RRAM device 400, an electrical potential applied to the top electrode 430 is higher than an electrical potential applied to the bottom electrode 410. When the reverse bias is applied to the $HfO_2$-based RRAM device 400, the electrical potential applied to the top electrode 430 is lower than the electrical potential applied to the bottom electrode 410.

(Operation of $HfO_2$-Based RRAM Device)

Following is an explanation of the operation of the $HfO_2$-based RRAM device 400. Before the $HfO_2$-based RRAM device 400 is used as a resistive memory element, an RRAM forming operation is performed. During the forming operation, a first forward bias is applied to the $HfO_2$-based RRAM device 400. In response to the first forward bias, the Ti layer 420b captures oxygen ions from the $HfO_2$ layer 420a to become a TiOx layer, and oxygen vacancies are formed in the $HfO_2$ layer 420a. When the $HfO_2$-based RRAM device 400 is used to store data, either one of a set operation or a reset operation may be performed. During the set operation, a second forward bias is applied to the $HfO_2$-based RRAM device 400. In response to the second forward bias, the oxygen ions in the $HfO_2$ layer 420a are driven to the $TiO_x$ layer, and thus more oxygen vacancies are formed in the $HfO_2$ layer 420a. Eventually, the amount of the oxygen vacancies in the $HfO_2$ layer 420a exceeds a certain threshold, such that the oxygen vacancies form conducting filaments inside the $HfO_2$ layer 420a. As a result, the $HfO_2$-based RRAM device 400 is set to a low resistance state (LRS). During the reset operation, a reverse bias is applied to the $HfO_2$-based RRAM device 400. In response to the reverse bias, the oxygen ions are driven down from the TiOx layer and combine with the oxygen vacancies in the conducting filaments, and thus the amount of the conducting filaments in the $HfO_2$ layer 420a is reduced. As a result, the $HfO_2$-based RRAM device 400 is reset to a high resistance state (HRS).

(Operation of Non-Volatile Flip-Flop Circuit)

Following is an explanation of operations of the non-volatile flip-flop circuit 14. The operations of the non-volatile flip-flop circuit 14 include a normal operation, a store operation, and a restore operation.

Figure 5:
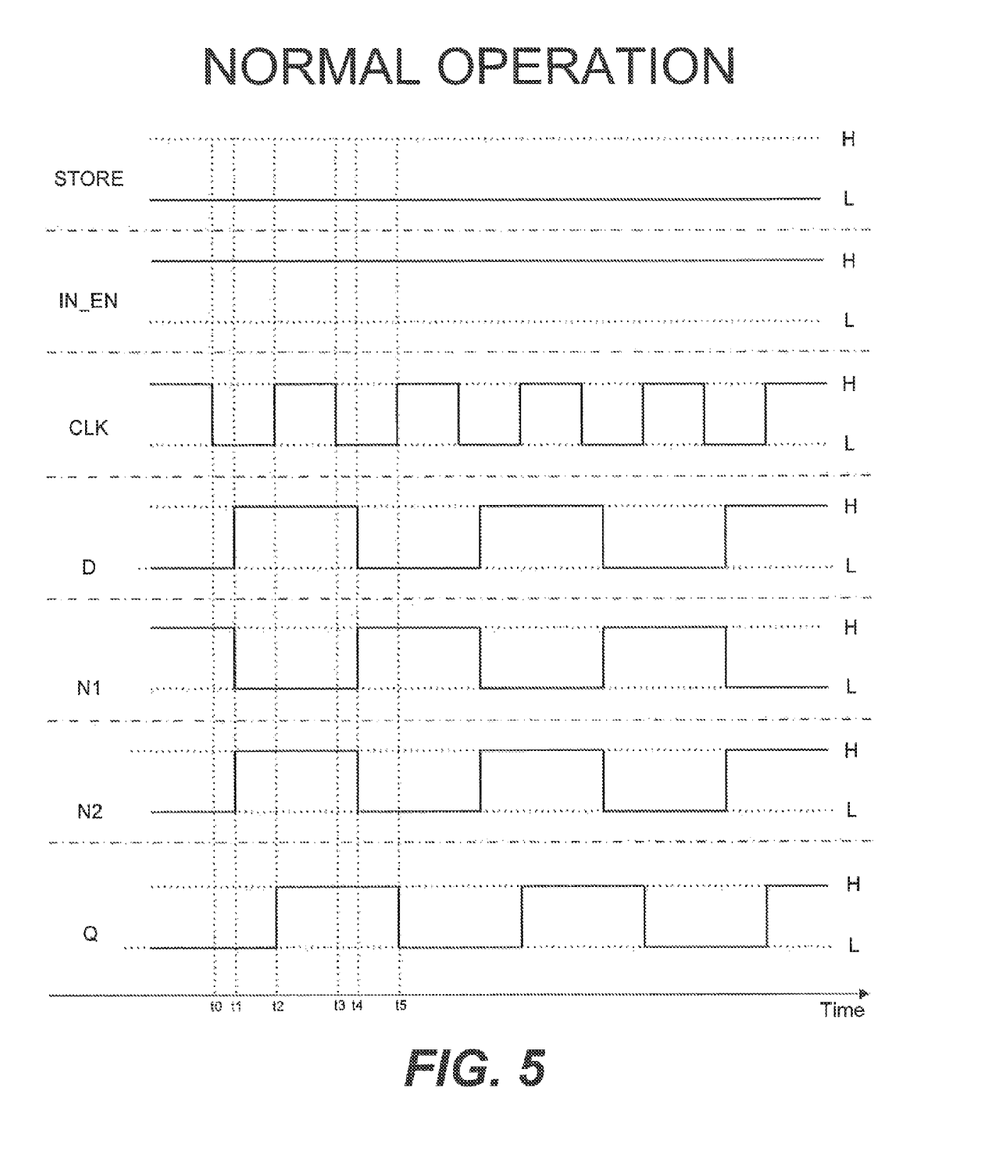
FIG. 5 is a timing chart showing an example of a normal operation of the non-volatile flip-flop circuit of FIG. 3 according to an exemplary embodiment.

FIG. 5 is a timing chart showing an example of a normal operation of the non-volatile flip-flop circuit 14 according to an embodiment. During the normal operation, the store signal STORE supplied by the storage controller 12 remains at a low level, such that the NMOS transistors M7 and M8 are turned off. No current flows between the node N1, the resistive memory element R1, and the NMOS transistor M7. Likewise, no current flows between the node N2, the resistive memory element R2, and the NMOS transistor M8. Therefore, the control portion 340 and the non-volatile memory portion 350 do not affect the operation of the volatile memory portion 330, which operates as a volatile memory device. During the entire normal operation, the input enable signal IN_EN is set to a high level and the inverted input enable signal IN_EN_B is set to a low level, which allows the volatile memory portion 330 to receive the input data D. At time t0, the clock signal CLK transitions to a low level and the inverted clock signal CLK_B transitions to a high level. In response to the inverted clock signal CLK_B at the high level, NMOS transistors M5 and M6 are turned on, such that the input data D is received by the inverters IV1 and IV2. At time t1, the input data D transitions to "1", i.e., a high level. In response to the input data D at the high level, the electrical potential at the node N1 is low, and the electrical potential at the node N2 is high.

At time t2, the clock signal CLK transitions to the high level and the inverted clock signal CLK_B transitions to the low level. In response to the inverted clock signal CLK_B at the low level, NMOS transistors M5 and M6 are turned off, such that no input data is received by the inverters IV1 and IV2. Therefore, the electrical potentials at nodes N1 and N2 remain unchanged. In the meantime, in response to the clock signal CLK at the high level, the slave latch circuit 310 connected to the node N2 having the high electrical potential, outputs the output data Q at a high level. At time t3, the clock signal CLK transitions to the low level and the inverted clock signal CLK_B transitions to the high level. In response to the inverted clock signal CLK_B at the high level, NMOS transistors M5 and M6 are turned on, such that the input data D is received by the inverters IV1 and IV2. At time t4, the input data D transitions to "0", i.e., a low level. In response to the input data D at the low level, the electrical potential at the node N1 is high, and the electrical potential at the node N2 is low. At time t5, the clock signal CLK transitions to the high level and the inverted clock signal CLK_B transitions to the low level. In response to the inverted clock signal CLK_B at the low level, NMOS transistors M5 and M6 are turned off, such that no input data is received by the inverters IV1 and IV2. Therefore, the electrical potentials at nodes N1 and N2 remain unchanged. In the meantime, in response to the clock signal CLK at the high level, the slave latch circuit 310 connected to the node N2 having the low electrical potential, outputs the output data Q at a low level. As a result, the input data D is stored at the node N2, and the inverted input data D_B is stored at the node N1. When the clock signal CLK transitions to a high level, the slave latch circuit 310 receives the input data D that is stored at the node N2, and outputs the input data D as the output data Q.

Figure 6:
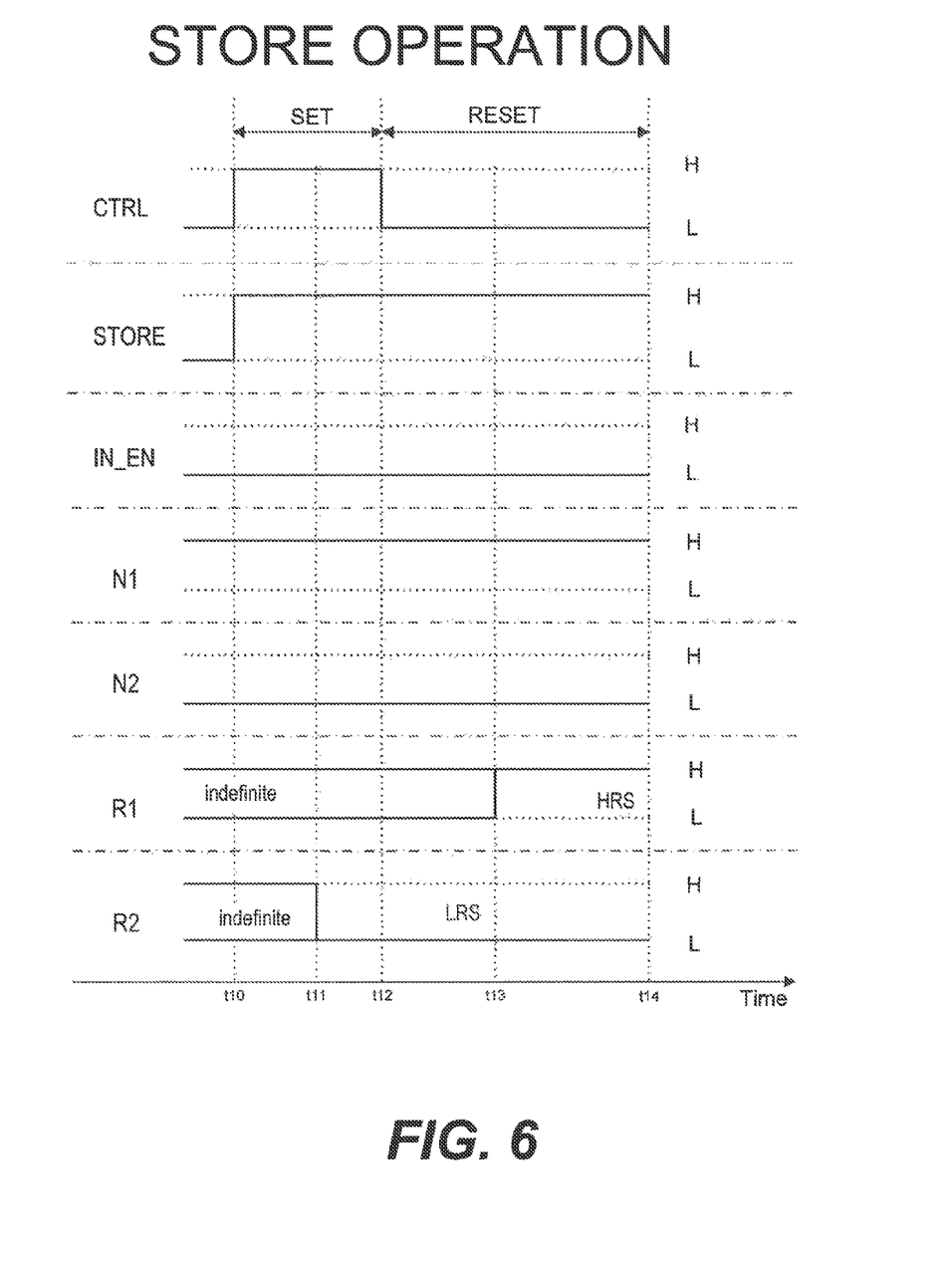
FIG. 6 is a timing chart showing an example of a store operation of the non-volatile flip-flop circuit of FIG. 3 according to an exemplary embodiment.

FIG. 6 is a timing chart showing an example of a store operation of the non-volatile flip-flop circuit 14 according to an embodiment. In this example, it is assumed that logic data "1" is stored at the node N1 such that the node N1 has a high electrical potential, and logic data "0" is stored at the node N2 such that the node N2 has a low electrical potential. During the entire store operation, the input enable signal IN_EN is set to a low level such that no input data D is received by the volatile memory portion 330. At the beginning of the store operation, the resistance states of the resistive memory elements R1 and R2 are indefinite. In this example, the store operation includes a set operation followed by a reset operation for sequentially changing the resistance states of the resistive memory elements R2 and then R1. First, during the set operation, at time t10, the store signal STORE supplied from the storage controller 12 transitions to a high level, such that the NMOS transistors M7 and M8 are turned on. In addition, the control signal CTRL supplied from the storage controller 12 transitions to a high level. In response to the high level control signal CTRL, the electrical potentials at the nodes N3 and N4 are high. Because the node N1 has the high electrical potential, the electrical potentials at the top and bottom terminals of the resistive memory element R1 are both high. Therefore, the resistance of the resistive memory element R1 does not change. On the other hand, because the node N2 has the low electrical potential, a forward bias is applied to the resistive memory element R2. As a result, the resistance of the resistive memory element R2 transitions to, i.e., is set to, LRS at time t11. That is, the resistive memory element R2 stores logic data "0" in LRS. The lapse between time t11 and time t10 is due to a device switching time in the resistive memory element R2. When the forward bias applied to the resistive memory element R2 increases, the lapse between times t11 and t10 decreases. Therefore, in order to store logic data in the resistive memory element R2 in a short time period, the level of the control signal CTRL should be relatively high. In some embodiments, during the set operation, the power signal CVDD supplied from the storage controller 12 is also increased to a certain degree in order to facilitate the setting of the resistive memory electrode R2 to LRS.

Next, during the reset operation, the control signal CTRL transitions to a low level at time t12. In response to the low level control signal CTRL, the electrical potentials at the nodes N3 and N4 are low. Because the node N1 has the high electrical potential, a reverse bias is applied to the resistive memory element R1. As a result, the resistance of the resistive memory element R1 transitions to, i.e., is reset to, HRS at time t13. That is, the resistive memory element R1 stores logic data "1" in HRS. Again, the lapse between time t13 and time t12 is due to a device switching time in the resistive memory element R1. On the other hand, because the node N2 has the low electrical potential, the electrical potentials at the top and bottom terminals of the resistive memory element R2 are both low. Therefore, the resistance of the resistive memory element R2 does not change. As a result, the logic data stored at the nodes N1 and N2 is stored to the resistive memory elements R1 and R2 in different resistance states. After the reset operation, the electronic system 10 may enter a standby state (power off). For example, the power signal CVDD and the store signal STORE may transition to a low level at time t14. As a result, the electrical potential at the node N1 may become low. However, the resistance states of the resistive memory elements R1 and R2 remain unchanged.

In another example of the store operation (not shown), the control signal CTRL is first set to a low level, and then to a high level. In response to the control signal CTRL, the resistive memory element R1 is reset to HRS, and then the resistive memory element R2 is reset to LRS. In this manner, the control signal CTRL controls the reset operation to be followed by the set operation for sequentially changing the resistances of resistive memory elements R1 and then R2.

Figure 7:
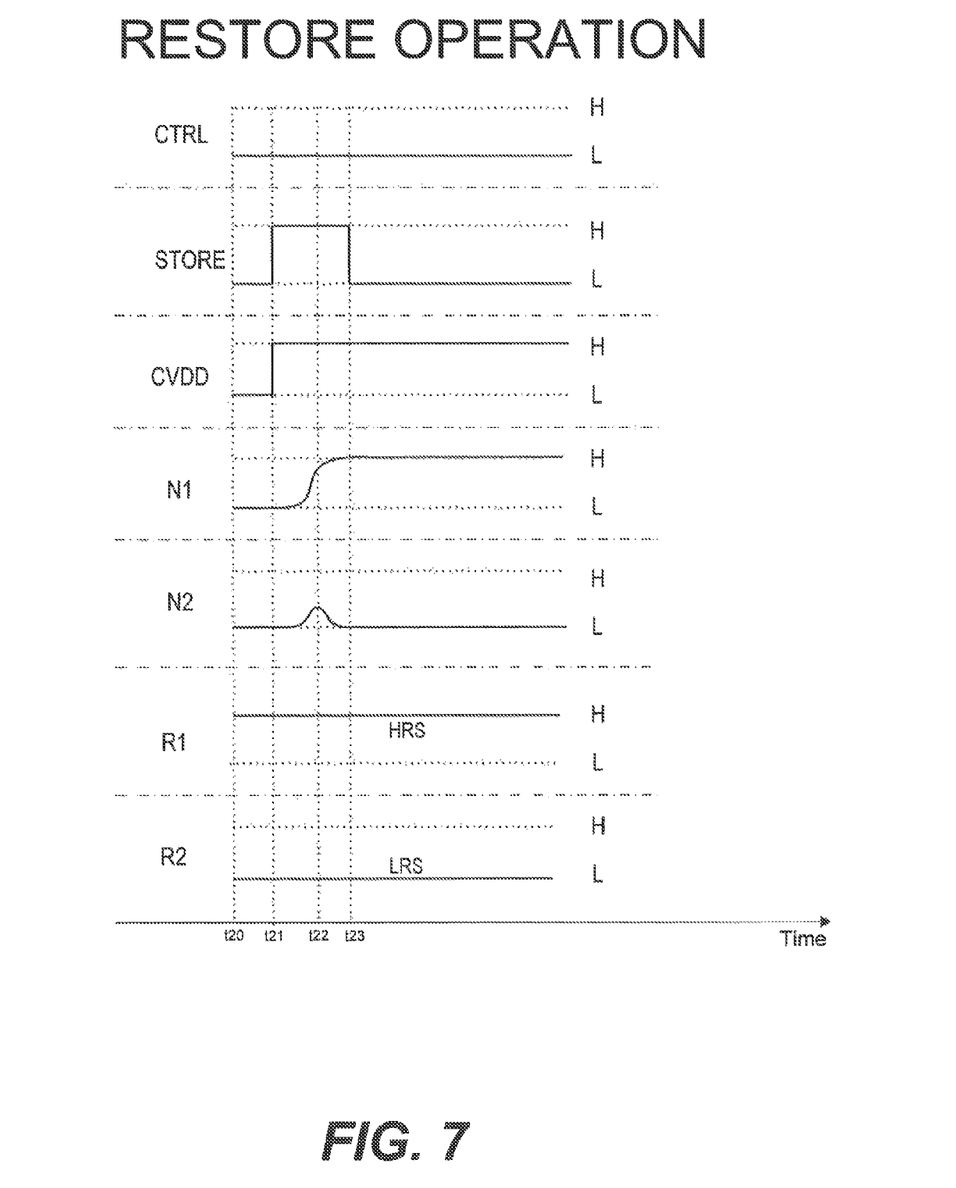
FIG. 7 is a timing chart showing an example of a restore operation of the non-volatile flip-flop circuit of FIG. 3 according to an exemplary embodiment.

FIG. 7 is a timing chart showing an example of a restore operation of the non-volatile flip-flop circuit 14 according to an embodiment. The restore operation is performed when the electronic system 10 that includes the non-volatile flip-flop circuit 14 is restored to a power on state from a standby (power off) state, that is, the power signal CVDD transitions to a high level from a low level (reference or ground level). In this example, it is assumed that the resistive memory element R1 stores logic data "1" in HRS and the resistive memory element R2 stores logic data "0" in LRS immediately before entering the standby state. At time t20, the electronic system 10 is in the standby state, the power signal CVDD is at the low level, and the electronic potentials at the nodes N1 and N2 are low. At time t21, the electronic system 10 transitions to a power on state, the power signal CVDD transitions to the high level, and the store signal STORE transitions to the high level. However, the control signal CTRL remains at the low level. In response to the store signal STORE at the high level, the NMOS transistors M7 and M8 are turned on, and current flow through both of the resistive memory elements R1 and R2. This causes the electrical potentials at both nodes N1 and N2 to increase to intermediate levels between the high level and the low level at time t22. The electrical potentials at the nodes N1 and N2 change according to the magnitudes of the current flowing through each of the resistive memory elements R1 and R2, respectively. Because the resistive memory element R1 is in HRS and the resistive memory element R2 is in LRS, the magnitude of the current flowing through the resistive memory element R1 is smaller than that of the current flowing through the resistive memory element R2. Consequently, the electrical potential at the node N1 is larger than the electrical potential at the node N2. The potential difference between the node N1 and the N2 is amplified by a forward amplifying effect of the cross-coupled inverters IV1 and IV2. Therefore, at time t23, the electrical potential at the node N1 increases to the high level, and the electrical potential at the node N2 decreases to the low level. As a result, the logic data stored at the resistive memory elements R1 and R2 immediately before the power-off state is restored to the nodes N1 and N2.

Figure 8:
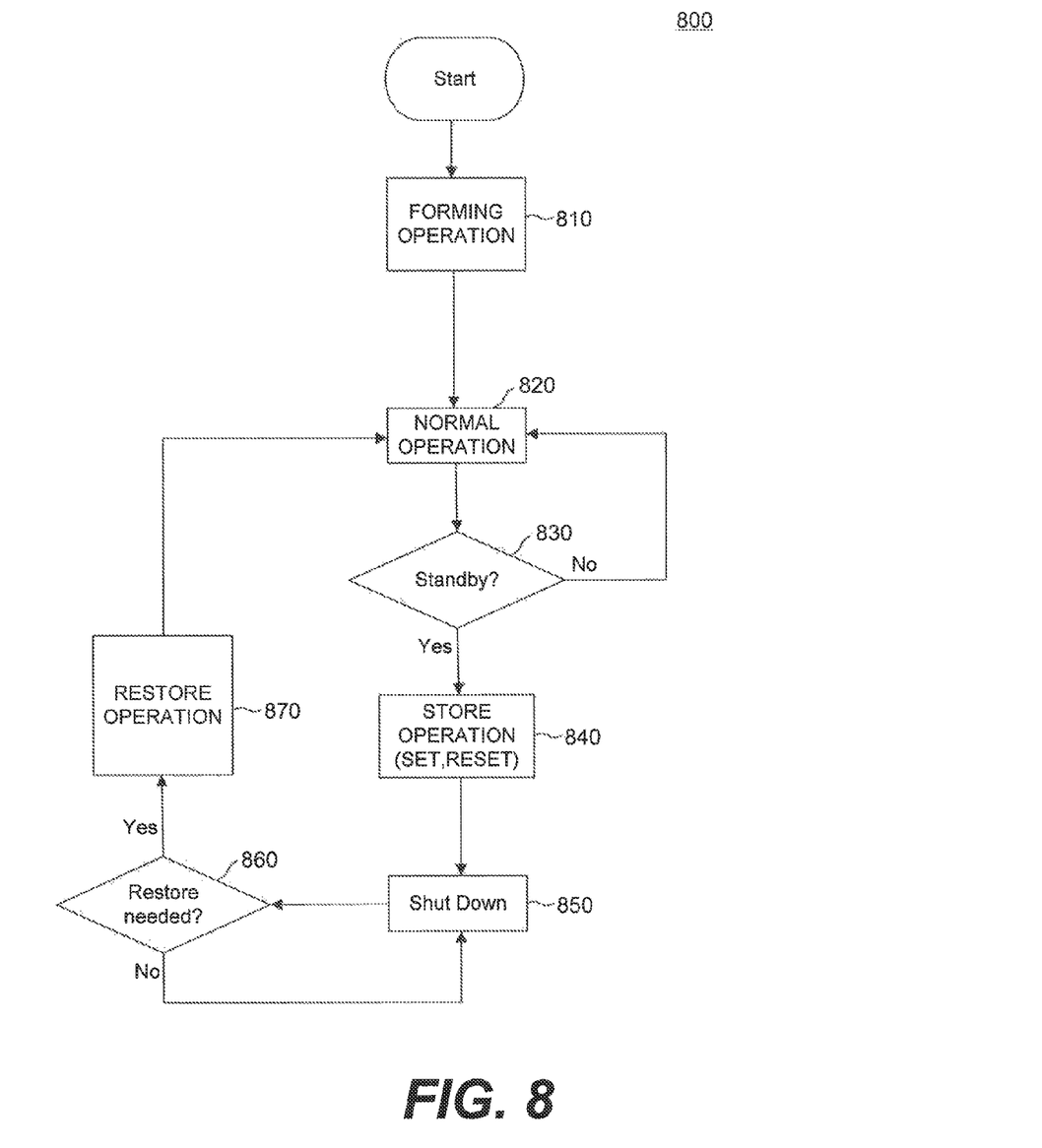
FIG. 8 is a flow chart outlining a method for operating the non-volatile flip-flop circuit of FIG. 3 according to an exemplary embodiment.

FIG. 8 is a flow chart 800 outlining a method for operating the non-volatile flip-flop circuit 14 according to an embodiment. This method may be implemented by a computer or a processor for controlling the non-volatile flip-flop circuit 14. First, an RRAM forming operation is performed on the resistive memory elements R1 and R2 (step 810). In this step, a forward bias potential is applied to each one of the resistive memory elements R1 and R2 to form oxygen vacancies. After the forming operation, the non-volatile flip-flop circuit 14 is operated in a normal operation (step 820). In this step, the store signal STORE remains at a low level and the input data D is stored at the nodes N1 and N2 and is output as the output data Q. Then, it is determined whether a standby state is pending, i.e., whether the system that includes the non-volatile flip-flop circuit 14 will be set in a standby state (power-off state) in the immediate future (step 830). When the system will not be set in the standby state in the immediate future (step 830, No), the process returns to the normal operation of step 820. Otherwise, when the system will be set in the standby state in the immediate future (step 830, Yes), the non-volatile flip-flop circuit 14 is operated in a store operation (step 840). In this step, the logic data stored at the nodes N1 and N2 is stored to the resistive memory elements R1 and R2. Next, the system is shut down to be set in the standby state (step 850). After a certain period of time, it is determined whether a restore operation is required (step 860). For example, the restore operation is required when the system returns to a power on state from the standby state. When the restore operation is not required (step 860, No), the process returns to step 850 where the system remains in the standby state. Otherwise, when the restore operation is required (step 860, Yes), the non-volatile flip-flop circuit 14 is operated to perform the restore operation (step 870). In this step, the logic data stored at the resistive memory elements R1 and R2 is restored to the nodes N1 and N2.

Although the resistive memory elements R1 and R2 included in the non-volatile flip-flop circuit 14 of this embodiment are $HfO_2$-based RRAM devices, it is to be understood that the disclosure is not limited to this embodiment, and the resistive memory elements R1 and R2 may be formed of other devices such as, for example, magnetoresistive random access memory (MRAM) devices and spin transfer torque (STT) MRAM devices. The resistance state of the MRAM device is varied based on a direction of current flowing through the MRAM device.

Other embodiments of the invention will be apparent to those skilled in the art from consideration of the specification and practice of the invention disclosed herein. The scope of the invention is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A memory storage circuit, comprising:
    a volatile memory portion including a first node and a second node to store a pair of complementary logic data as respective different electrical potentials;
    a control portion including a first transistor and a second transistor each including a gate electrode, a first electrode, and a second electrode, the gate electrode of the first transistor and the gate electrode of the second transistor being coupled to receive a store signal, and the first electrode of the first transistor and the first electrode of the second transistor being coupled to receive a control signal; and
    a non-volatile memory portion including a first resistive memory element and a second resistive memory element to store the pair of complementary logic data as respective different resistance states, the first resistive memory element being coupled between the second electrode of the first transistor and the first node, and the second resistive memory element being coupled between the second electrode of the second transistor and the second node,
    wherein each one of the first resistive memory element and the second resistive memory element is a resistive random access memory (RRAM) device that includes a first electrode, a second electrode, and an oxygen getter layer between the first electrode and the second electrode,
    the second electrode of the first resistive memory element is coupled to the second electrode of the first transistor, and the first electrode of the first resistive memory element is coupled to the first node,
    the second electrode of the second resistive memory element is coupled to the second electrode of the second transistor, and the first electrode of the second resistive memory element is coupled to the second node, and
    the resistance state of the RRAM device is changed based on a direction of voltage bias applied to the RRAM device.

2. The memory storage circuit claim 1, wherein the RRAM device is a $HfO_2$-based RRAM device.

3. The memory storage circuit of claim 1, wherein
    the volatile memory portion includes a first inverter and a second inverter cross-coupled to each other,
    an output terminal of the first inverter and an input terminal of the second inverter are connected to the first node, and
    an output terminal of the second inverter and an input terminal of the first inverter are connected to the second node.

4. The memory storage circuit of claim 3, wherein each one of the first inverter and the second inverter includes a PMOS transistor and an NMOS transistor.

5. The memory storage circuit of claim 3, wherein the volatile memory portion further includes:
    a third inverter coupled to receive input data;
    a first pass transistor coupled to receive inverted input data from the third inverter and supply the inverted input data to the first node; and
    a second pass transistor coupled to receive the input data and supply the input data to the second node.

6. The memory storage circuit of claim 1, wherein each one of the first transistor and the second transistor is an NMOS transistor.

7. The memory storage circuit of claim 1, further including a slave latch circuit coupled to the second node of the volatile memory portion and outputting logic data stored in the second node in response to a clock signal.

8. A method of driving a memory storage circuit, the method comprising:
    performing a store operation for storing a pair of complementary logic data with different electrical potentials to a first resistive memory element in a non-volatile memory portion and a second resistive memory element in the non-volatile memory portion as different resistance states, wherein each of the first and second resistive memory elements is a resistive random access memory (RRAM) device that includes a first electrode, a second electrode, and an oxygen getter layer between the first electrode and the second electrode, the first and second electrodes of the first resistive memory element are respectively coupled to a first node in a volatile memory portion and a second electrode of a first transistor in a control portion, and the first and second electrodes of the second resistive memory element are respectively coupled to a second node in the volatile memory portion and a second electrode of a second transistor in the control portion, the store operation including:
    a first operation for configuring a first one of the first resistive memory element and the second resistive memory element to a low resistance state based on the electrical potentials at the first node in the volatile memory portion and the second node in the volatile memory portion; and a second operation for configuring a second one of the first resistive memory element and the second resistive memory element to a high resistance state based on the electrical potentials at the first node and the second node.

9. The method of claim 8, wherein the first operation is followed by the second operation.

10. The method of claim 8, wherein the second operation is followed by the first operation.

11. The method of claim 8, wherein the store operation further includes:

disabling receipt of input data at the volatile memory portion by supplying a low level input enable signal to a transmission gate coupled to the volatile memory portion;

turning on the first transistor in the control portion and the second transistor in the control portion by supplying a high level store signal to a gate electrode of the first transistor and a gate electrode of the second transistor;

performing the first operation by applying a forward bias to the first one of the first resistive memory element and the second resistive memory element; and performing the second operation by applying a reverse bias to the second one of the first resistive memory element and the second resistive memory element.

12. The method of claim 11, wherein the applying the forward bias to the first one of the first resistive memory element and the second resistive memory element includes supplying a high level control signal to the first electrode of the first transistor and the first electrode of the second transistor, and the applying the reverse bias to the second one of the first resistive memory element and the second resistive memory element includes supplying a low level control signal to the first electrode of the first transistor and the first electrode of the second transistor.

13. The method of claim 8, further including a restore operation for restoring the pair of complementary logic data stored at the first resistive memory element and the second resistive memory element to the first node and the second node of the volatile memory portion, the restore operation includes:

supplying a high level power signal to the volatile memory portion;

turning on the first transistor in the control portion and the second transistor in the control portion by supplying a high level store signal to a gate electrode of the first transistor and a gate electrode of the second transistor; and causing current to flow through each one of the first resistive memory element and the second resistive memory element by supplying a low level control signal to the first electrode of the first transistor and the first electrode of the second transistor.

14. The method of claim 8, further including a normal operation for receiving input data at the volatile memory portion, storing the input data at the first node and the second node of the volatile memory portion, and outputting the data stored at the second node of the volatile memory portion in response to a clock signal, the normal operation includes:

turning off the first transistor in a control portion and the second transistor in the control portion by supplying a low level store signal to a gate electrode of the first transistor and a gate electrode of the second transistor.

15. A method of driving a memory storage circuit, the method comprising:

receiving logic data at a volatile memory portion, storing the logic data in the volatile memory portion, and outputting the logic data stored in the volatile memory portion;

determining whether a standby state is pending, and when a standby state is pending, storing the logic data stored in the volatile memory portion to a first resistive memory element and a second resistive memory element, wherein each of the first and second resistive memory elements is a resistive random access memory (RRAM) device that includes a first electrode, a second electrode, and an oxygen getter layer between the first electrode and the second electrode; and determining whether a restore operation is required, and when a restore operation is required, restoring the logic data stored in the first resistive memory element and the second resistive memory element to the volatile memory portion, wherein the storing the logic data stored in the volatile memory portion to the first resistive memory element and the second resistive memory element includes:

configuring a first one of the first resistive memory element and the second resistive memory element into a low resistance state; and configuring a second one of the first resistive memory element and the second resistive memory element into a high resistance state.

16. The method of claim 15, further including forming oxygen vacancies in the first resistive memory element and the second resistive memory element.

* * * * *